(12) United States Patent
Dai et al.

(10) Patent No.: US 8,008,573 B2
(45) Date of Patent: Aug. 30, 2011

(54) INTEGRATED PACKAGE STRUCTURE HAVING SOLAR CELL AND THERMOELECTRIC ELEMENT AND METHOD OF FABRICATING THE SAME

(75) Inventors: Ming-Ji Dai, Chiayi County (TW);
Chun-Kai Liu, Taipei (TW);
Chih-Kuang Yu, Chiayi (TW);
Cheng-Ta Ko, Taipei (TW);
Tsung-Chieh Cheng, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 444 days.

(21) Appl. No.: 11/956,325

(22) Filed: Dec. 13, 2007

(65) Prior Publication Data

US 2008/0295878 A1  Dec. 4, 2008

(30) Foreign Application Priority Data

Jun. 4, 2007 (TW) .............................. 96119906 A

(51) Int. Cl.
*H01L 31/024* (2006.01)
*H01L 31/058* (2006.01)
(52) U.S. Cl. ........................................ 136/248; 136/206
(58) Field of Classification Search ........... 136/200–265
See application file for complete search history.

(56) References Cited

U.S. PATENT DOCUMENTS

| | | | |
|---|---|---|---|
| 3,956,017 A * | 5/1976 | Shigemasa | 136/206 |
| 4,710,588 A | 12/1987 | Ellion | |
| 5,043,024 A | 8/1991 | Cammerer et al. | |
| 5,936,193 A * | 8/1999 | Parise | 136/205 |
| 5,966,939 A | 10/1999 | Tauchi | |
| 2002/0062854 A1 * | 5/2002 | Sharp | 136/203 |
| 2003/0221717 A1 | 12/2003 | Dessel | |
| 2006/0162766 A1 * | 7/2006 | Gee et al. | 136/256 |
| 2006/0243317 A1 | 11/2006 | Venkatasubramanian | |

FOREIGN PATENT DOCUMENTS

| JP | 09051115 A | * | 2/1997 |
|---|---|---|---|
| TW | M288110 | | 3/2006 |

OTHER PUBLICATIONS

English machine translation of Kono (JP 09-051115 A), published Feb. 1997.*
"Office Action of Taiwan Counterpart Application", issued on May 9, 2011, p.1-p.4, in which the listed reference was cited.

* cited by examiner

*Primary Examiner* — Basia Ridley
*Assistant Examiner* — Christina Chern
(74) *Attorney, Agent, or Firm* — Jianq Chyun IP Office

(57) ABSTRACT

An integrated package structure having a solar cell and a thermoelectric element includes a substrate, a first solar cell and a thermoelectric element. The substrate has a first surface. The first solar cell has a second surface, a first electrode disposed on the second surface and a second electrode disposed on the second surface. The second surface faces the first surface. The thermoelectric element has a third electrode and a fourth electrode. The thermoelectric element is disposed between the first surface and the second surface. The first electrode and the second electrode are electrically connected to the third electrode and the fourth electrode respectively. A method of fabricating the integrated package structure having the solar cell and the thermoelectric element is also provided.

14 Claims, 10 Drawing Sheets

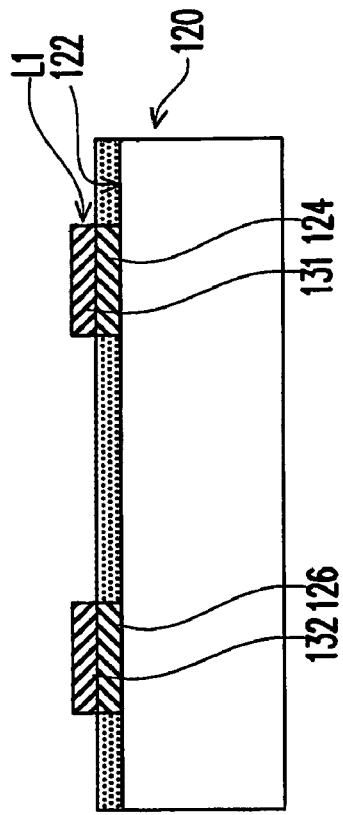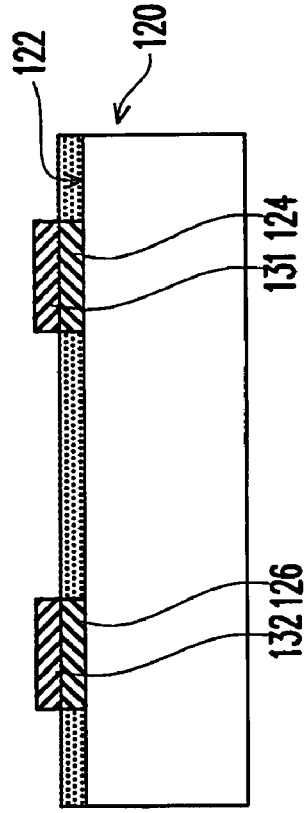
FIG. 3A
FIG. 3B

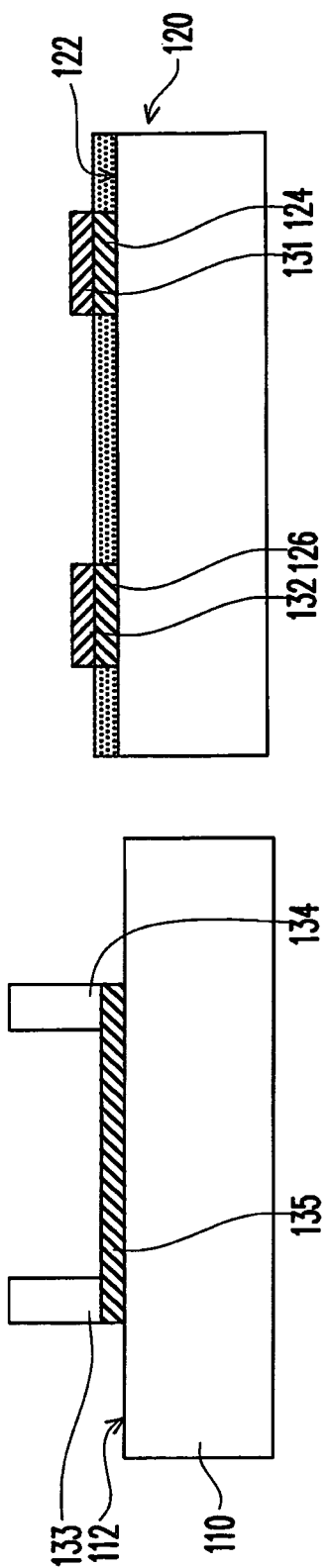
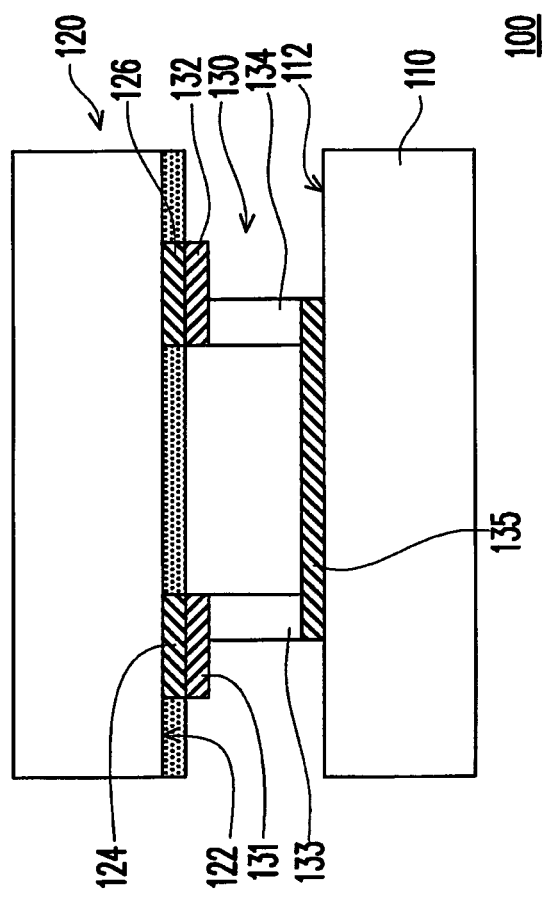
FIG. 3C
FIG. 3D

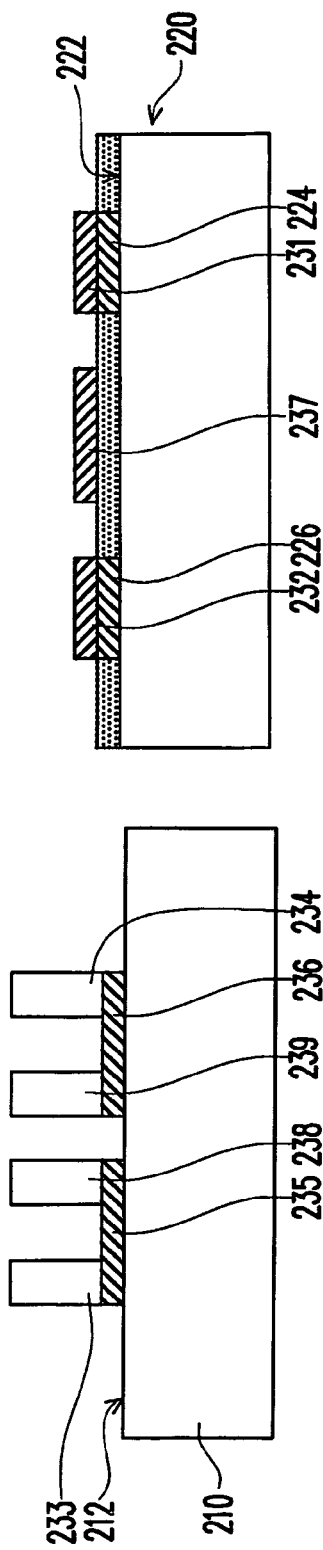
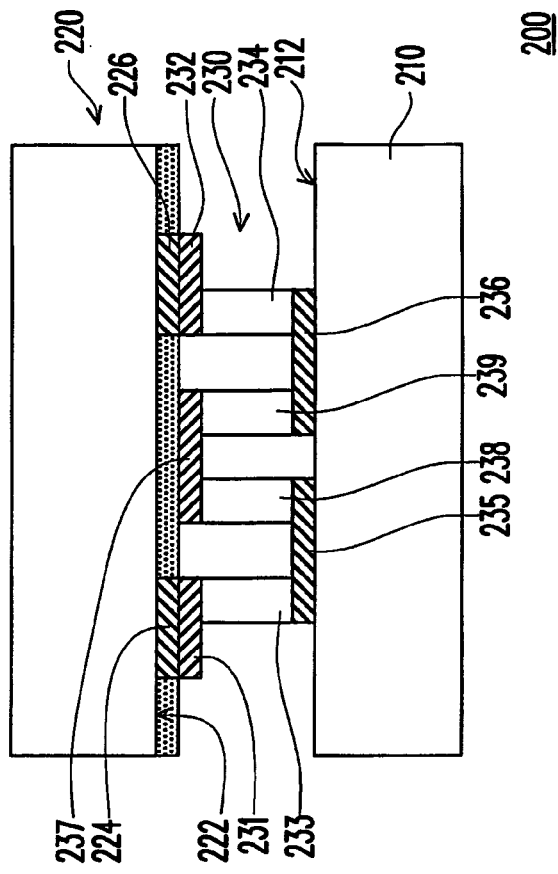
FIG. 5C
FIG. 5D

INTEGRATED PACKAGE STRUCTURE HAVING SOLAR CELL AND THERMOELECTRIC ELEMENT AND METHOD OF FABRICATING THE SAME

CROSS-REFERENCE TO RELATED APPLICATION

This application claims the priority benefit of Taiwan application serial no. 96119906, filed on Jun. 4, 2007. The entirety of the above-mentioned patent application is hereby incorporated by reference herein and made a part of this specification.

BACKGROUND OF THE INVENTION

1. Field of the Invention

The present invention relates to a package structure and a method of fabricating the same. More particularly, the present invention relates to an integrated package structure having a solar cell and a thermoelectric element and a method of fabricating the same.

2. Description of Related Art

As the consciousness of environmental protection gradually raises, how to reduce environmental pollution has become one of the major issues the world is facing today. The semiconductor industry also dedicates itself to researching and developing electronic elements conducive to environmental protection. Thermoelectric elements and solar cells are two primary products to which much research and development has been directed.

The theoretical basis for thermoelectric elements, i.e., thermoelectric coolers or thermoelectric generators, was discovered long ago by scientists in the early $19^{th}$ century. The Seebeck effect enunciated by German scientist Thomas Johann Seebeck in 1821 lays the foundation for subsequent research and development of thermoelectric generators. Before long, in 1834 French watchmaker Jean Charles Athanase Peltier enunciated the Peltier effect, which serves as the foundation for subsequent research and development of thermoelectric coolers. However, thermoelectric elements did not appear in the market until 1960 as the semiconductor industry gradually developed.

The operating principles of thermoelectric elements are briefly described as follows. When a direct current passes through a thermoelectric element, one end of the thermoelectric element generates heat and the other end absorbs heat. The end generating heat is called a "hot end", and the end absorbing heat is called a "cold end." The advantages of thermoelectric elements are small volume, no noise, no environmental pollution (because thermoelectric elements do not use any refrigerant), long lifespan and no directional limitation (because thermoelectric elements may be disposed upside down or on the sides). Moreover, thermoelectric elements are usually applied in the cooling of central processing units (CPUs) in computers, dehumidifiers or mini refrigerators.

The method of generating electric power by means of solar energy is different from conventional power-generating methods. The conventional power-generating methods, such as fossil fuel power generation or nuclear power generation, would pollute the environment and consume the limited resources on the earth. In order to avoid environmental pollution and natural disasters resulted from global warming, there is a growing demand for renewable energy sources from humankind. Solar energy has advantages as being safe, clean and pollution-free, and its source of supply is inexhaustible and never deficient. Therefore, application of solar energy has become an excellent alternative most valued nowadays.

In light of the above-mentioned, adopting solar cells as a power source for driving thermoelectric elements will be worth researching.

SUMMARY OF THE INVENTION

The present invention provides an integrated package structure having a solar cell and a thermoelectric element. The integrated package structure having a solar and a thermoelectric element includes a substrate, a first solar cell and a thermoelectric element. The substrate has a first surface. The first solar cell has a second surface, a first electrode disposed on the second surface, and a second electrode disposed on the second surface. The second surface faces the first surface. The thermoelectric element has a third electrode and a fourth electrode. The thermoelectric element is disposed between the first surface and the second surface. The first electrode and the second electrode are electrically connected to the third electrode and the fourth electrode respectively.

The present invention provides a method of fabricating an integrated package structure having a solar cell and a thermoelectric element. The fabricating method includes the following steps. First, a substrate having a first surface is provided. Next, a first solar cell is provided. The first solar cell has a second surface, a first electrode disposed on the second surface, and a second electrode disposed on the second surface. Afterwards, a thermoelectric element is formed between the first surface and the second surface so that a third electrode and a fourth electrode of the thermoelectric element are electrically connected to the first electrode and the second electrode of the solar cell respectively. The second surface faces the first surface.

Since the solar cell and the thermoelectric element are integrated in a package structure, a volume of the integrated package structure having the solar cell and the thermoelectric element of the present invention is smaller, and the operation of the integrated package structure is in accordance with demand for environmental protection.

In order to the make the present invention comprehensible, embodiments accompanied with figures are described in detail below.

BRIEF DESCRIPTION OF THE DRAWINGS

FIGS. 3A through 3D are schematic views illustrating process flow for forming the thermoelectric element of FIG. 2B between a substrate and a solar cell.

FIGS. 5A through 5D are schematic views illustrating process flow for forming the thermoelectric element in FIG. 4 between a substrate and a solar cell.

DESCRIPTION OF EMBODIMENTS

First Embodiment

Figure 1:
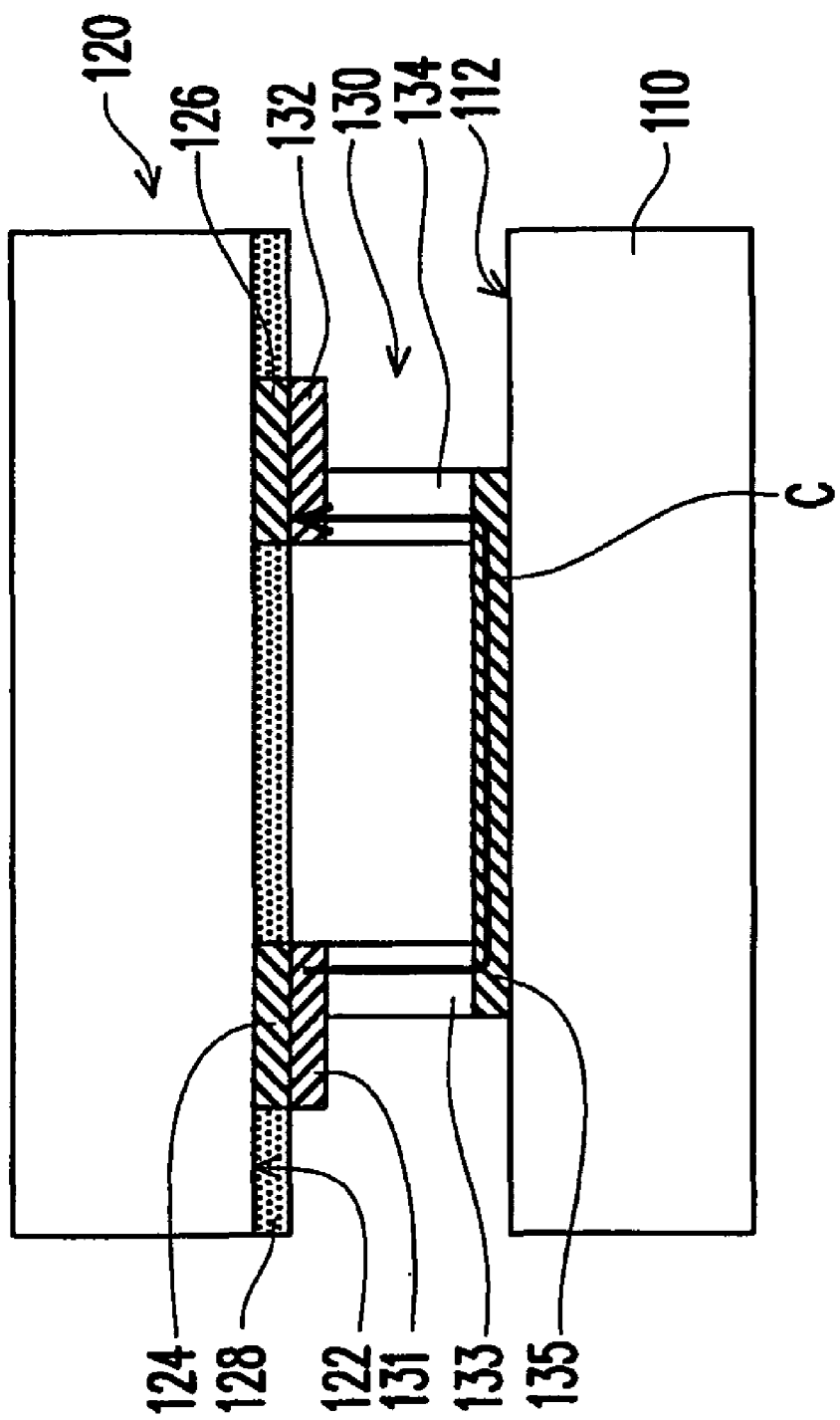
FIG. 1 illustrates a schematic side view of the integrated package structure having a solar cell and a thermoelectric element according to the first embodiment of the present invention.

FIG. 1 illustrates a schematic side view of an integrated package structure having a solar cell and a thermoelectric element according to the first embodiment of the present invention. Referring to FIG. 1, an integrated package structure 100 having a solar cell and a thermoelectric element in the first embodiment includes a substrate 110, a solar cell 120 and a thermoelectric element 130. The substrate 110 has a surface 112. The solar cell 120 has a surface 122 and two electrodes 124 and 126 disposed on the surface 122. The surface 122 faces the surface 112. The thermoelectric element 130 has two electrodes 131 and 132. The thermoelectric element 130 is disposed between the surface 112 of the substrate 110 and the surface 122 of the solar cell 120. The electrode 124 and the electrode 126 are electrically connected to the electrode 131 and the electrode 132 respectively. In other words, the solar cell 120 and the thermoelectric element 130 form a current loop.

In the first embodiment, the solar cell 120 may have an insulation layer 128 (such as silicon dioxide) disposed on the surface 122 and exposing the electrodes 124 and 126. The insulation layer 128 is used for protecting a surface circuit (not illustrated) of the solar cell 120 and preventing the surface circuit from electrically connecting with the thermoelectric element 130 unnecessarily. Furthermore, the substrate 110 may be a rigid substrate, such as a silicon substrate or a ceramic substrate.

In the first embodiment, the thermoelectric element 130 includes an N-type semiconductor 133, a P-type semiconductor 134 and an electrode 135. The N-type semiconductor 133 is electrically connected to the electrode 131. The P-type semiconductor 134 is electrically connected to the electrode 132. The electrode 135 is electrically connected between the N-type semiconductor 133 and the P-type semiconductor 134 and disposed on the surface 112.

When the solar cell 120 applies a direct current voltage to the thermoelectric element 130, a direct current C may flow from the electrode 124 to the electrode 126 such that the electrodes 131 and 132 become hot ends and the electrode 135 becomes a cold end. It should be explained that when the direct current C flows in an opposite direction, the electrodes 131 and 132 of the thermoelectric element become cold ends and the electrode 135 becomes a hot end. The direction of the direct current C depends on requirements of a designer. However, the above-mentioned situation is not illustrated in drawings of the present invention.

Figure 2A:
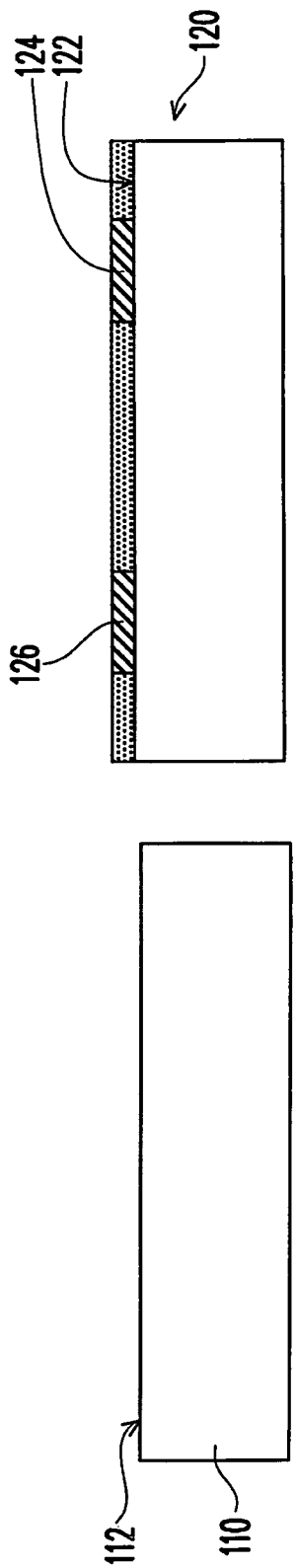
FIGS. 2A through 2B are schematic views illustrating process flow for fabricating the integrated package structure having a solar cell and a thermoelectric element according to the first embodiment of the present invention.
Figure 2B:
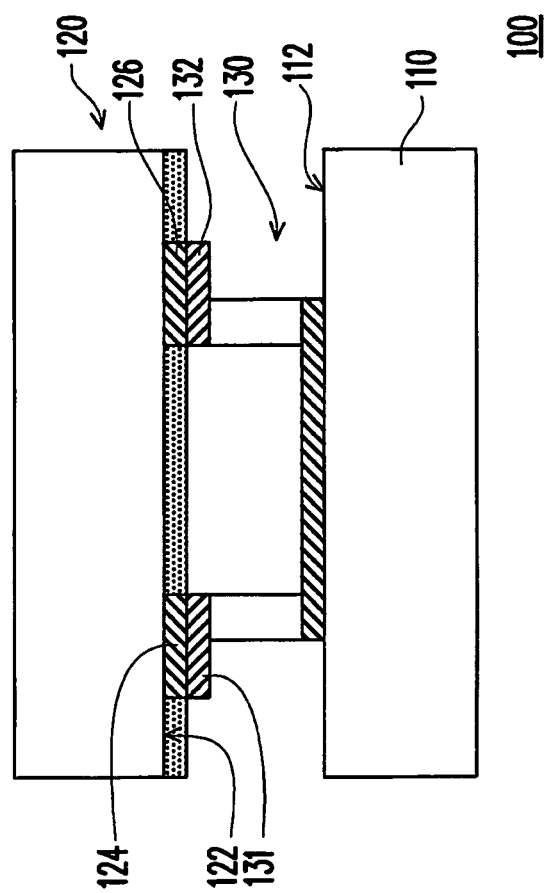

A method of fabricating the integrated package structure 100 having the solar cell and the thermoelectric element is disclosed in the following. FIGS. 2A through 2B are schematic views illustrating process flow for fabricating the integrated package structure having a solar cell and a thermoelectric element according to the first embodiment of the present invention. The fabricating method of the integrated package structure 100 having the solar cell and the thermoelectric element includes steps as follows. First, referring to FIG. 2A, the substrate 110 having the surface 112 is provided. Then, the solar cell 120 having the surface 122 and the two electrodes 124 and 126 disposed thereon is provided.

Referring to FIG. 2B, the thermoelectric element 130 is formed between the surface 112 of the substrate 110 and the surface 122 of the solar cell 120 such that the two electrodes 131 and 132 of the thermoelectric element 130 are electrically connected to the electrodes 124 and 126 respectively. The surface 122 of the solar cell 120 faces the surface 112 of the substrate 110. Up until this step, the integrated package structure 100 having the solar cell and the thermoelectric element according to the first embodiment of the present invention has already been completed.

A step of forming the thermoelectric element 130 between the surface 112 of the substrate 110 and the surface 122 of the solar cell 120 is further described in detail as follows. FIGS. 3A through 3D are schematic views illustrating process flow for forming the thermoelectric element of FIG. 2B between the substrate and the solar cell. Specifically, in the first embodiment of the present invention, the step of forming the thermoelectric element 130 between the surface 112 and the surface 122 includes the following procedures. First, referring to FIG. 3A, a patterned electrode layer L1 is formed on the surface 122 of the solar cell 120. The patterned electrode layer L1 has the electrodes 131 and 132, and the electrodes 131 and 132 are electrically connected to the electrodes 124 and 126 respectively. Afterwards, referring to FIG. 3B, a patterned electrode layer L2 is formed on the surface 112 of the substrate 110. The patterned electrode layer L2 has the electrode 135.

Thereafter, referring to FIG. 3C, the N-type semiconductor 133 and the P-type semiconductor 134 are formed. In the first embodiment, the N-type semiconductor 133 and the P-type semiconductor 134 may be formed on the electrode 135 through solder (not illustrated). It should be explained that the N-type semiconductor 133 and the P-type semiconductor 134 may be formed on the electrode 131 and the electrode 132 respectively according to designing requirements, but the above-mentioned is not illustrated in the drawings herein.

Referring to FIG. 3D, the solar cell 120 and the substrate 110 are assembled so that the N-type semiconductor 133 is electrically connected between the electrode 131 and the electrode 135, and that the P-type semiconductor 134 is electrically connected between the electrode 132 and the electrode 135. In the first embodiment, the N-type semiconductor 133 and the P-type semiconductor 134 may be electrically connected to the electrode 131 and the electrode 132 respectively through solder (not illustrated).

Second Embodiment

Figure 4:
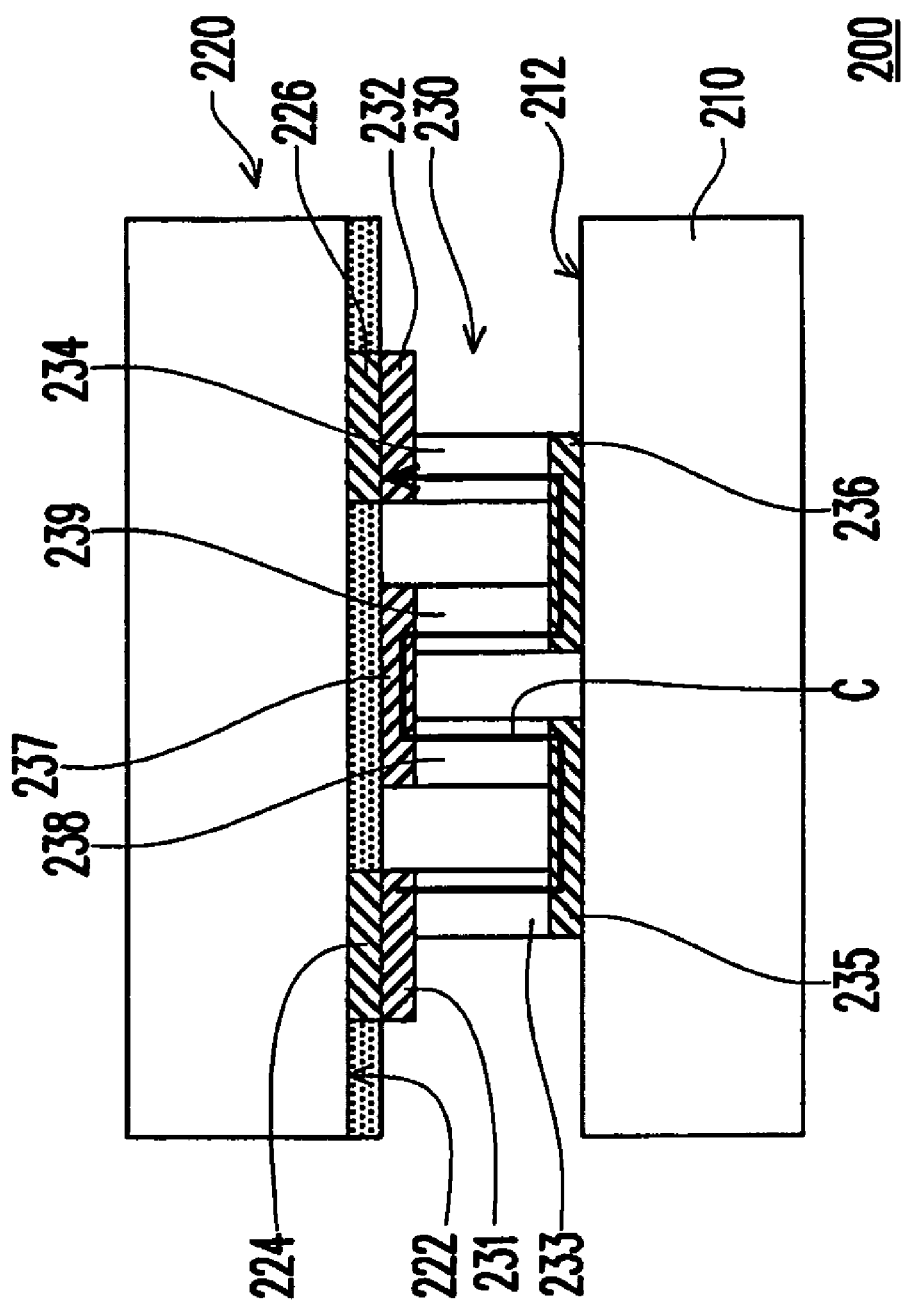
FIG. 4 illustrates a schematic side view of the integrated package structure having a solar cell and a thermoelectric element according to the second embodiment of the present invention.
Figure 5A:
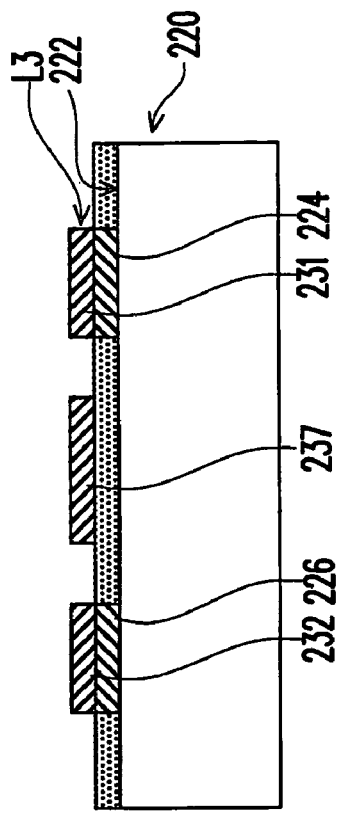
Figure 5A:
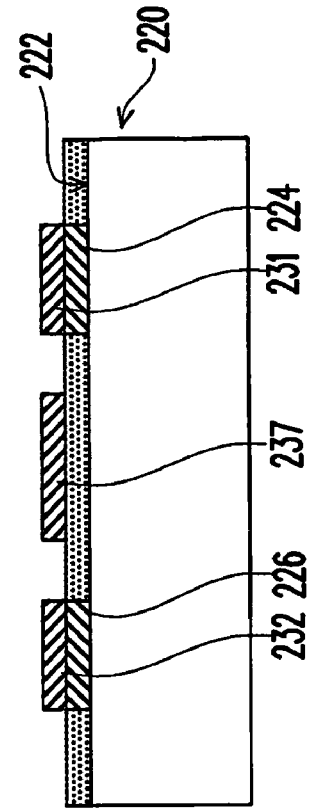
Figure 5B:
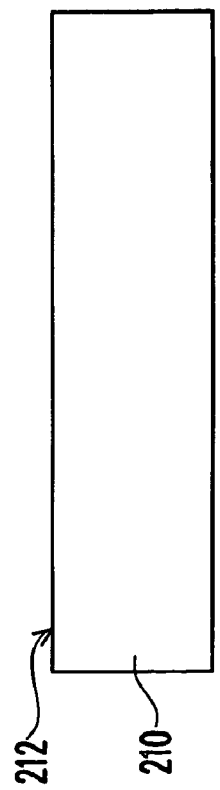
Figure 5B:
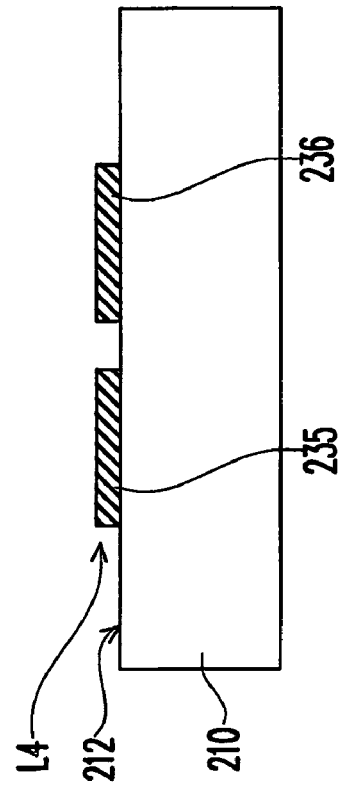

FIG. 4 illustrates a schematic side view of an integrated package structure having a solar cell and a thermoelectric element according to the second embodiment of the present invention. Referring to FIG. 4, the primary difference between the first embodiment and the second embodiment lies in that the thermoelectric element 230 of the integrated package structure 200 having the solar cell and the thermoelectric element further includes an electrode 236, an electrode 237, a P-type semiconductor 238 and an N-type semiconductor 239. The electrode 236 is disposed on the surface 212 of a substrate 210. The electrode 237 is disposed on the surface 222 of a solar cell 220 and located between the electrode 231 and the electrode 232.

The electrode 235 is electrically connected between the N-type semiconductor 233 and the P-type semiconductor 238. The electrode 237 is electrically connected between the P-type semiconductor 238 and the N-type semiconductor 239. The electrode 236 is electrically connected between the N-type semiconductor 239 and the P-type semiconductor 234.

In the second embodiment, according to relative positions illustrated in FIG. 4 for example, the N-type semiconductor 233, the P-type semiconductor 238, the N-type semiconductor 239 and the P-type semiconductor 234 are arranged alternately from left to right. Therefore, when the direct current C flows from an electrode 224 of the solar cell 220 to an electrode 226 thereof, the electrodes 231, 232 and 237 of thermoelectric element 230 become hot ends and the electrodes 235 and 236 become cold ends. It should be explained that when the direct current C flows in an opposite direction, the electrodes 231, 232 and 237 of the thermoelectric element 230 become cold ends and the electrodes 235 and 236 become hot ends. The direction of the direct current C depends on requirements of a designer. However, the above-mentioned situation is not illustrated in the drawings of the present invention.

It should also be noted that the number of the N-type semiconductors of the thermoelectric element, the number of the P-type semiconductors of the thermoelectric element and in the thermoelectric element the number of electrodes of which each connects the N-type and the P-type semiconductors adjacent to each other may be changed according to designing requirements. Hence, the embodiments of the present invention simply serve as examples and are not intended to limit the present invention.

A step of forming the thermoelectric element 230 between the surface 212 of the substrate 210 and the surface 222 of the solar cell 220 is further described in detail as follows. FIGS. 5A through 5D are schematic views illustrating process flow for forming the thermoelectric element in FIG. 4 between the substrate and the solar cell. First, referring to FIG. 5A, a patterned electrode layer L3 is formed on the surface 222 of the solar cell 220. The patterned electrode layer L3 has the electrodes 231, 232 and 237. The electrodes 231 and 232 are electrically connected to the electrodes 224 and 226 of the solar cell 220. The electrode 237 is located between the electrodes 231 and 232. Afterwards, referring to FIG. 5B, a patterned electrode layer L4 is formed on the surface 212 of the substrate 210. The patterned electrode layer L4 has the electrodes 235 and 236.

Referring to FIG. 5C, the N-type semiconductor 233, the P-type semiconductor 238, the N-type semiconductor 239 and the P-type semiconductor 234 are formed. In the second embodiment, the N-type semiconductor 233 and the P-type semiconductor 238 may be formed on the electrode 235 through solder (not illustrated). The N-type semiconductor 239 and the P-type semiconductor 234 may be formed on the electrode 236 through solder (not illustrated). It should be explained that the N-type semiconductor 233 and the P-type semiconductor 234 may be formed on the electrode 231 and the electrode 232 respectively according to designing requirements. The P-type semiconductor 238 and the N-type semiconductor 239 may be formed on the electrode 237 according to designing requirements. However, the aforesaid situations are not illustrated in the drawings of the present invention.

Referring to FIG. 5D, the solar cell 220 and the substrate 210 are assembled so that the N-type semiconductor 233 is electrically connected between the electrode 231 and the electrode 235, the P-type semiconductor 238 is electrically connected between the electrode 235 and the electrode 237, the N-type semiconductor 239 is electrically connected between the electrode 237 and the electrode 236, and the P-type semiconductor 234 is electrically connected between the electrode 236 and the electrode 232. In the second embodiment, the N-type semiconductor 233 and the P-type semiconductor 234 may be electrically connected to the electrode 231 and the electrode 232 respectively through solder (not illustrated), and the P-type semiconductor 238 and the N-type semiconductor 239 may be electrically connected to the electrode 237 through solder (not illustrated).

Third Embodiment

Figure 6:
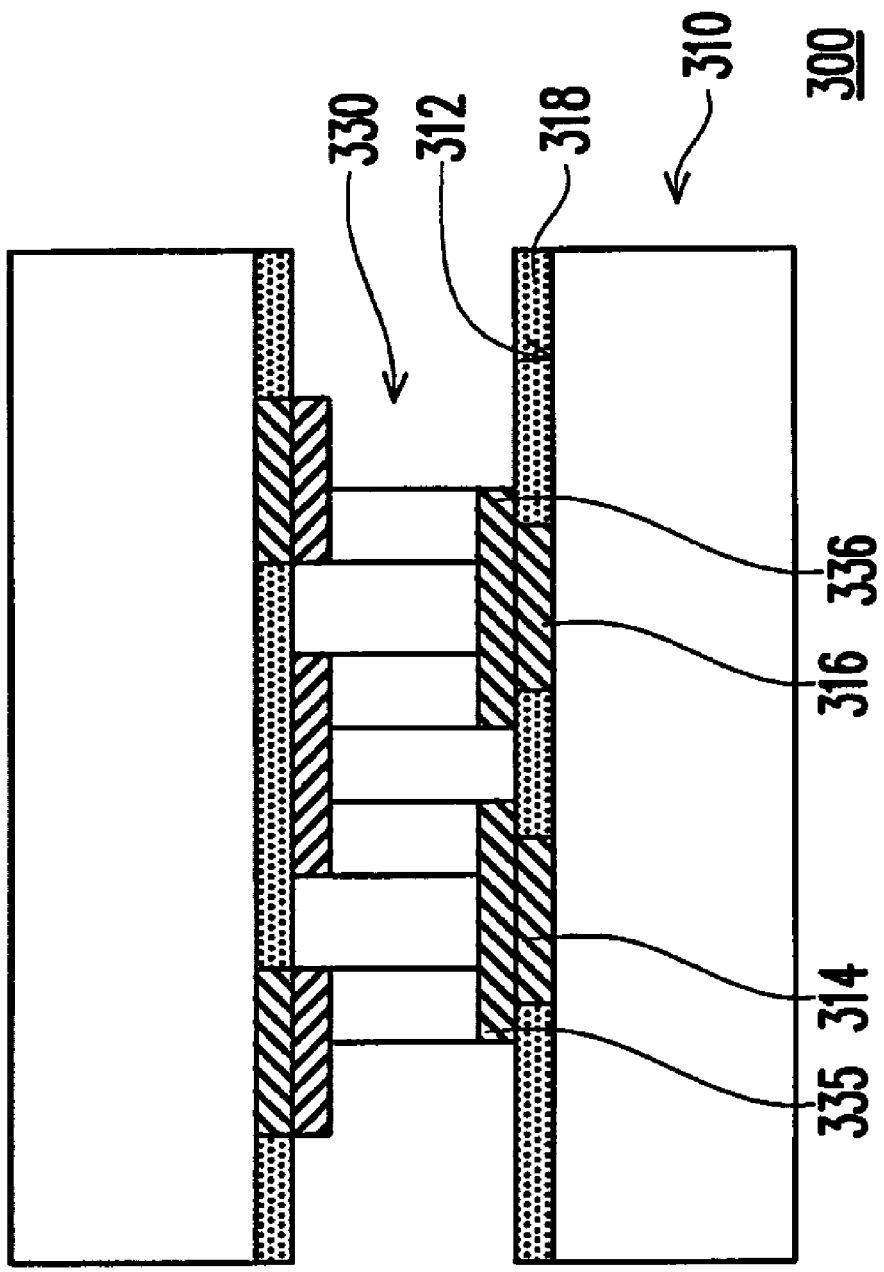
FIG. 6 illustrates a schematic side view of the integrated package structure having a solar cell and a thermoelectric element according to the third embodiment of the present invention.

FIG. 6 illustrates a schematic side view of the integrated package structure having a solar cell and a thermoelectric element according to the third embodiment of the present invention. Referring to FIG. 6, the primary difference between the third embodiment and the aforesaid embodiments lies in that the substrate 310 of the integrated package structure 300 having a solar cell and a thermoelectric element may be another solar cell.

The substrate 310 such as the solar cell has two electrodes 314 and 316 disposed on the surface 312 of the substrate 310. The electrodes 314 and 316 are electrically connected to electrodes 335 and 336 of the thermoelectric element 330 respectively. Furthermore, the substrate 310 such as the solar cell may have an insulation layer 318 disposed on the surface 312 and exposing the electrodes 314 and 316. The function of the insulation layer 318 is similar to that of the insulation layer 128 (referring to FIG. 1), and is therefore not to be reiterated herein.

Fourth Embodiment

Figure 7:
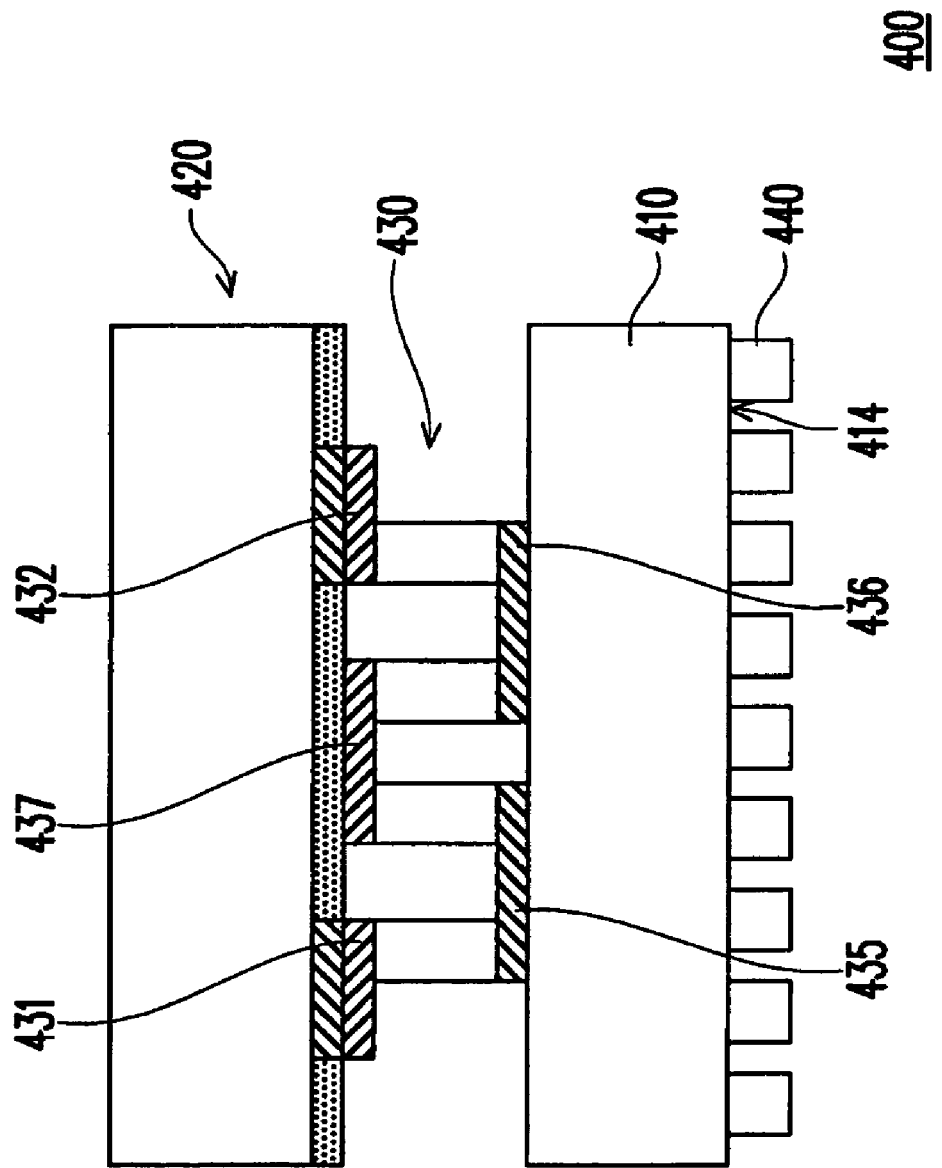
FIG. 7 illustrates a schematic side view of the integrated package structure having a solar cell and a thermoelectric element according to the fourth embodiment of the present invention.

FIG. 7 illustrates a schematic side view of the integrated package structure having a solar cell and a thermoelectric element according to the fourth embodiment of the present invention. Referring to FIG. 7, the primary difference between the fourth embodiment and the aforesaid embodiments lies in that the integrated package structure 400 having a solar cell and a thermoelectric element in the fourth embodiment further includes a plurality of light-emitting elements 440 (such as light-emitting diodes, LEDs) disposed on a surface 414 of a substrate 410.

When the light-emitting elements 440 are driven by an externally applied voltage to illuminate, the thermoelectric element 430 is driven by the solar cell 420 such that electrodes 431, 432 and 437 become hot ends and electrodes 435 and 436 become cold ends. Therefore, the electrodes 435 and 436 as cold ends may absorb heat generated by the light-emitting elements 440 which illuminates such that the heat is transferred from the light-emitting elements 440.

Certainly, the light-emitting elements 440 may also be driven by the solar cell 420 to illuminate under an appropriate circuit design. Alternatively speaking, the solar cell 420 may serve as a driving power source for the light-emitting elements 440 and the thermoelectric element 430.

It should also be noted that the number of the N-type semiconductors of the thermoelectric element 430, the number of the P-type semiconductors of the thermoelectric element 430 and in the thermoelectric element 430 the number of electrodes of which each connects the N-type and the P-type semiconductors adjacent to each other may be changed according to designing requirements. Hence, the embodiments of the present invention simply serve as examples and are not intended to limit the present invention.

Fifth Embodiment

Figure 8:
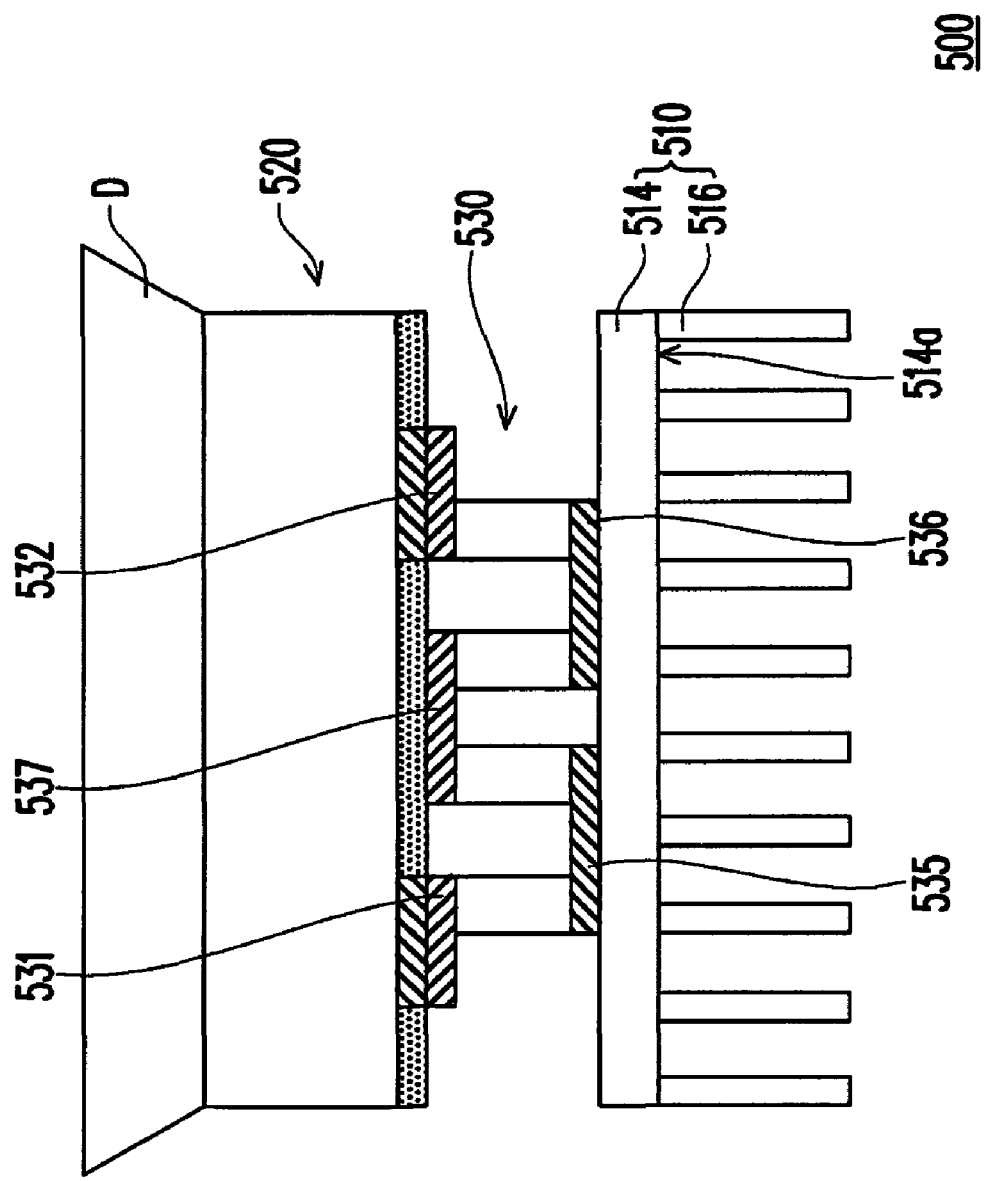
FIG. 8 illustrates a schematic side view of the integrated package structure having a solar cell and a thermoelectric element according to the fifth embodiment of the present invention.

FIG. 8 illustrates a schematic side view of the integrated package structure having a solar cell and a thermoelectric element according to the fifth embodiment of the present invention. Referring to FIG. 8, the primary difference between the fifth embodiment and the aforesaid embodiments lies in that the substrate 510 of the integrated package structure 500 having a solar cell and a thermoelectric element may be a heat-dissipating element including a base 514 and a plurality of fins 516. A thermoelectric element 530 is disposed on the base 514, and the fins 516 are disposed on a surface 514a of the base 514 wherein the surface 514a is far away from the thermoelectric element 530. Moreover, a condenser D may be disposed on the solar cell 520.

When external light irradiates the condenser D, the condenser D condenses the light to increase the photoelectric transducing efficiency of the solar cell 520. The thermoelectric element 530 is driven by a portion of electricity from the solar cell 520 so that electrodes 531, 532 and 537 become hot ends and electrodes 535 and 536 become cold ends. Since the condenser D causes the temperature of the solar cell 520 to rise, the temperature difference between the solar cell 520 and the electrodes 535 and that between the solar cell 520 and the electrodes 536 are increased respectively. Electricity generated by the aforementioned temperature differences may be in serial connection with the solar cell 520 under an appropriate circuit design such that electricity outputted by the solar cell 520 is increased.

It should also be noted that the number of the N-type semiconductors of the thermoelectric element 530, and the number of the P-type semiconductors of the thermoelectric element 530 and in the thermoelectric element 530 the number of the electrodes of which each connects the N-type and the P-type semiconductors adjacent to each other may be changed according to designing requirements. Hence, the embodiments of the present invention simply serve as examples and are not intended to limit the present invention.

In summary, the integrated package structure having the solar cell and the thermoelectric element and the fabricating method thereof in the present invention have at least the following advantages.

Since the solar cell and the thermoelectric element are integrated in a package structure, the volume of the integrated package structure having the solar cell and the thermoelectric element of the present invention is smaller.

Since the solar cell and the thermoelectric element are integrated in a package structure, the operation of the integrated package structure having the solar cell and the thermoelectric element of the present invention is in accordance with demand for environmental protection.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An integrated package structure having a solar cell and a thermoelectric element, comprising:
   a substrate, having a first surface;
   a first solar cell, having a second surface, a first electrode disposed on the second surface and a second electrode disposed on the second surface, wherein the second surface faces the first surface; and
   a thermoelectric element, having a third electrode and a fourth electrode, wherein the thermoelectric element is disposed between the first surface and the second surface, and the first electrode and the second electrode are in direct physical contact with and electrically connected to the third electrode and the fourth electrode respectively.

2. The integrated package structure as claimed in claim 1, wherein the thermoelectric element comprises:
   a first N-type semiconductor, electrically connected to the third electrode;
   a first P-type semiconductor, electrically connected to the fourth electrode; and
   a fifth electrode, electrically connected between the first N-type semiconductor and the first P-type semiconductor and disposed on the first surface.

3. The integrated package structure as claimed in claim 2, wherein the thermoelectric element further comprises:
   a sixth electrode, disposed on the first surface;
   a seventh electrode, disposed on the second surface and located between the third electrode and the fourth electrode;
   a second P-type semiconductor, wherein the fifth electrode is electrically connected between the first N-type semiconductor and the second P-type semiconductor; and
   a second N-type semiconductor, wherein the seventh electrode is electrically connected between the second P-type semiconductor and the second N-type semiconductor, and the sixth electrode is electrically connected between the second N-type semiconductor and the first P-type semiconductor.

4. The integrated package structure as claimed in claim 3, wherein the substrate is a second solar cell having an eighth electrode disposed on the first surface and a ninth electrode disposed on the first surface, and the eighth electrode and the ninth electrode are electrically connected to the fifth electrode and the sixth electrode respectively.

5. The integrated package structure as claimed in claim 1, wherein the substrate is a heat-dissipating element comprising:
   a base, wherein the thermoelectric element is disposed on the base; and
   a plurality of fins, disposed on a third surface of the base, wherein the third surface is far away from the thermoelectric element.

6. The integrated package structure as claimed in claim 1, further comprising a plurality of light-emitting elements disposed on a third surface of the substrate.

7. A method of fabricating an integrated package structure having a solar cell and a thermoelectric element, comprising:
   providing a substrate having a first surface;
   providing a first solar cell having a second surface, a first electrode disposed on the second surface and a second electrode disposed on the second surface; and
   forming a thermoelectric element between the first surface and the second surface so as to electrically connect a third electrode and a fourth electrode of the thermoelectric element to the first electrode and the second electrode of the first solar cell respectively, wherein the second surface faces the first surface, and the first electrode and the second electrode are in direct physical contact with the third electrode and the fourth electrode respectively.

8. The method as claimed in claim 7, wherein the step of forming the thermoelectric element between the first surface and the second surface comprises:
   forming a first patterned electrode layer on the second surface, wherein the first patterned electrode layer has the third electrode and the fourth electrode, and the third electrode and the fourth electrode are electrically connected to the first electrode and the second electrode respectively;

forming a second patterned electrode layer on the first surface, wherein the second patterned electrode layer has a fifth electrode;

forming a first N-type semiconductor and a first P-type semiconductor; and assembling the first solar cell and the substrate so that the first N-type semiconductor is electrically connected between the third electrode and the fifth electrode, and the first P-type semiconductor is electrically connected between the fourth electrode and the fifth electrode.

9. The method as claimed in claim 8, wherein the first N-type semiconductor and the first P-type semiconductor are formed on the fifth electrode.

10. The method as claimed in claim 8, wherein the first N-type semiconductor and the first P-type semiconductor are formed on the third electrode and the fourth electrode respectively.

11. The method as claimed in claim 8, wherein the second patterned electrode layer further has a sixth electrode, and the first patterned electrode layer further has a seventh electrode located between the third electrode and the fourth electrode; before the first solar cell and the substrate are assembled, the method further comprises forming a second P-type semiconductor and a second N-type semiconductor; when the first solar cell and the substrate are assembled, the first N-type semiconductor is electrically connected between the third electrode and the fifth electrode, the second P-type semiconductor is electrically connected between the fifth electrode and the seventh electrode, the second N-type semiconductor is electrically connected between the seventh electrode and the sixth electrode, and the first P-type semiconductor is electrically connected between the sixth electrode and the fourth electrode.

12. The method as claimed in claim 11, wherein the first N-type semiconductor and the second P-type semiconductor are formed on the fifth electrode, and the second N-type semiconductor and the first P-type semiconductor are formed on the sixth electrode.

13. The method as claimed in claim 11, wherein the first N-type semiconductor and the first P-type semiconductor are formed on the third electrode and the fourth electrode respectively, and the second P-type semiconductor and the second N-type semiconductor are formed on the seventh electrode.

14. The method as claimed in claim 11, wherein the substrate is a second solar cell having an eighth electrode disposed on the first surface and a ninth electrode disposed on the first surface, and the eighth electrode and the ninth electrode are further electrically connected to the fifth electrode and the sixth electrode respectively when the first solar cell and the substrate are assembled.

* * * * *